(12) United States Patent
Bearda et al.

(10) Patent No.: US 7,060,587 B2
(45) Date of Patent: Jun. 13, 2006

(54) METHOD FOR FORMING MACROPORES IN A LAYER AND PRODUCTS OBTAINED THEREOF

(75) Inventors: Twan Bearda, Antwerp (BE); Eddy Kunnen, Kessel-Lo (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 0 days.

(21) Appl. No.: 11/045,954

(22) Filed: Jan. 28, 2005

(65) Prior Publication Data
US 2005/0189318 A1 Sep. 1, 2005

Related U.S. Application Data

(60) Provisional application No. 60/541,407, filed on Feb. 2, 2004.

(51) Int. Cl.
*H01L 21/76* (2006.01)
(52) U.S. Cl. ........................ 438/409; 438/960
(58) Field of Classification Search ................ 438/409, 438/960
See application file for complete search history.

(56) References Cited

U.S. PATENT DOCUMENTS

| 6,143,628 | A | 11/2000 | Sato et al. | |
|---|---|---|---|---|
| 6,662,631 | B1* | 12/2003 | Baklanov et al. ............... | 73/38 |
| 2003/0148088 | A1* | 8/2003 | Padmanabhan et al. .. | 428/304.4 |
| 2003/0222048 | A1* | 12/2003 | Asakawa et al. ............... | 216/2 |
| 2004/0053167 | A1* | 3/2004 | Hotta ...................... | 430/272.1 |
| 2005/0117194 | A1* | 6/2005 | Kim et al. .................. | 359/273 |
| 2005/0133910 | A1* | 6/2005 | Riedl et al. ................. | 257/729 |
| 2005/0255581 | A1* | 11/2005 | Kim et al. ............... | 435/287.2 |

FOREIGN PATENT DOCUMENTS

| EP | 0977280 A2 | 2/2000 |
|---|---|---|
| EP | 1132952 A1 | 9/2001 |

OTHER PUBLICATIONS

R.B. Wehrspohn, et al., Electrochemically Prepared Pore Arrays for Photonic-Crystal Applications, Material Research Bulletin, Aug. 2001, pp. 623-626.

M. Christophersen, et al., Crystal Orientation Dependence and Anisotropic Properties of Macropore Formation of p- and n-Type Silicon, Journal of Electrochemical Society, No. 148, 2001, E267-E275.

T. Sato, et al., SON (silicon on nothing) MOSFET using ESS (Empty Space in Silicon) technique for SoC applications, IEEE, 2001, pp. 809-812.

(Continued)

*Primary Examiner*—W. David Coleman
(74) *Attorney, Agent, or Firm*—Knobbe Martens Olson & Bear LLP (57) ABSTRACT

A method for forming macropores in a substrate is disclosed. On a substrate a pattern of submicron features is formed. This pattern is covered with a layer, which is preferably selectively removable with respect to the substrate and the submicron features. This cover layer is removed until the submicron features are exposed. The submicron features are then etched selectively to the cover layer, thereby creating a pattern of submicron openings in this cover layer. The patterned cover layer is used as a hardmask to etch macropores in the substrate.

24 Claims, 5 Drawing Sheets

OTHER PUBLICATIONS

R. Vos, et al., Removal of Submicrometer Particles from Silicon Wafer Surfaces Using HF-Based Cleaning Mixtures, Journal of Electrochemical Soc. 2001, No. 148, p. 683.

K. Kok, et al., In situ trench etching and releasing technique of high aspect ratio beams using magnetically enhanced reactive ion etching, J. Vac. Sci. Technol. B 20 (1), Jan./Feb. 2002, pp. 154-158.

* cited by examiner

METHOD FOR FORMING MACROPORES IN A LAYER AND PRODUCTS OBTAINED THEREOF

CROSS REFERENCE TO RELATED APPLICATION

This application claims priority to U.S. Provisional Patent Application 60/541,407 entitled "METHOD FOR FORMING MACROPORES IN A LAYER AND PRODUCTS OBTAINED THEREOF" and filed on Feb. 2, 2004. The disclosure of the above-described filed application is hereby incorporated by reference in its entirety.

FIELD OF THE INVENTION

The present invention is related to a method of forming macropores in a layer. This method can further comprise liftoff of the porous-made layer. This method can further comprise forming cavities in the porous-made layer.

BACKGROUND OF THE INVENTION

In the last decade luminescent microporous Si gained considerable interest and has been applied, for example, in solar cell applications or in optical devices.

Nowadays the interest in porous semiconductor materials is fuelled by the discovery of other kinds of pores and their corresponding properties.

Products relying on porous Si are readily commercially available. Meanwhile also other semiconductor materials are receiving more interest, such as III-V compounds or SiGe alloys. In porous form these compounds or alloys would also exhibit properties with a large potential for applications.

R. B Wehrspohn et al disclose in "Electrochemically Prepared Pore Arrays for Photonic-Crystal Applications", (Material Research Bulletin, August 2001, p 623–626) the use of macropores to form so-called photonic crystals. These macropores are formed by electrochemical etching. European patent application EP 1 132 952 discloses the formation and lift-off of porous silicon layers. These layers are used to manufacture Silicon-On-Insulator (SOI) substrates or fabricate photovoltaic cells on low-cost substrates. First a double-porous top layer is formed on a seed wafer by electrochemical etching. This double-porous layer can optionally be used as a starting layer to form epitaxial layers there upon. After bonding the seed wafer to a handle wafer the double-porous layer is used as a cleavage layer to split off the non-porous part of the seed wafer.

As already indicated above, one technique to produce porous materials is electrochemical etching, also known as anodization. It is considered to be the most appropriate and versatile one.

M. Christopher et al. discuss in "Crystal Orientation Dependence and Anisotropic Properties of Macropore Formation of p- and n-Type Silicon", Journal of Electrochemical Society 149 (2001) E267–E275, the formation of macropores in p- or n-type silicon substrates. The method requires at least one surface of this conductive substrate to be put into contact with an aqueous or organic HF-containing electrolyte, while a voltage difference is applied over the substrate and the electrolyte. By selecting the composition and the pH of the anodic etching solution and dependent on the electric biasing conditions, the diameter and the pitch of thus formed macropores can be controlled.

However these pores will preferentially have a <100>- crystal orientation and are thus crystal orientation dependent.

Furthermore electrochemical etching yields macropores with a large diameter, typically above 1 micrometer, which is sometimes to be avoided. Furthermore the etch rate of the electrochemical etching depends on the substrate dopant type and concentration.

Another technique to produce porous materials is disclosed by T. Sato, et al., in "SON (silicon on nothing) MOSFET using ESS (Empty Space in Silicon) technique for SOC applications (IEDM 2001, p 809–812). This paper illustrates the use of microchannels to form, depending on the pattern of these microchannels or macropores, spherical, pipe-shaped or plate-shaped empty spaces in the bulk of a semiconductor substrate. On the thin surface layer of semiconductor material overlying these empty spaces a transistor can be made, which is electrically insulated from the underlying semiconductor substrate by these subsurface voids. During processing first an oxide layer is formed over the semiconductor substrate. Openings are then defined in this oxide layer using lithographic processing and Reactive Ion Etching (RIE). Through these openings in the oxide trenches with a high aspect ratio are etched in the semiconductor substrate. Depending on the pattern of the thus formed trenches or microchannels empty spaces of various shapes can be obtained.

Although the use of lithographic processing allows forming microchannels with a small diameter, the manufacturing cost will however increase with shrinking diameter of the trenches.

For diameters of 150 nm or less, one have to use DUV lithography with requires dedicated masks sets, photosensitive resists and lithographic tools, all of which are very expensive.

An aim of the present invention is therefore to offer a method to form macropores having a small diameter, preferably less than 400 nanometers, without the need for lithographic processing.

One additional advantage of this method is that these macropores have a predetermined diameter, and that this method is independent of the substrate material.

SUMMARY OF CERTAIN INVENTIVE EMBODIMENTS

One disclosed inventive aspect is a method for forming macropores in a substrate, comprising the steps of forming on this substrate a pattern of submicron particles, covering this pattern of submicron particles with a layer, selectively removing this cover layer until the submicron particles are exposed, selectively removing the submicron particles to expose the substrate, and etching vias in the substrate using the cover layer as a hardmask.

The thus-etched vias can be expanded in a lateral direction to form subsurface voids or cavities.

BRIEF DESCRIPTION OF THE DRAWINGS

All drawings are intended to illustrate some aspects and embodiments of the present invention. Devices are depicted in a simplified way for reason of clarity. Not all alternatives and options are shown and therefore the invention is not limited to the content of the given drawings. Like numerals are employed to reference like parts in the different figures.

DETAILED DESCRIPTION OF CERTAIN INVENTIVE EMBODIMENTS

In relation to the drawings, inventive embodiments are described in detail below. It is apparent however that a skilled technologist could arrive at other embodiments or other ways of carrying out the invention, the spirit and scope of which being limited only by the claims.

In a first aspect of the present invention, a method is disclosed for forming macropores in a substrate, as illustrated by FIGS. 1A–D.

Figure 1A:
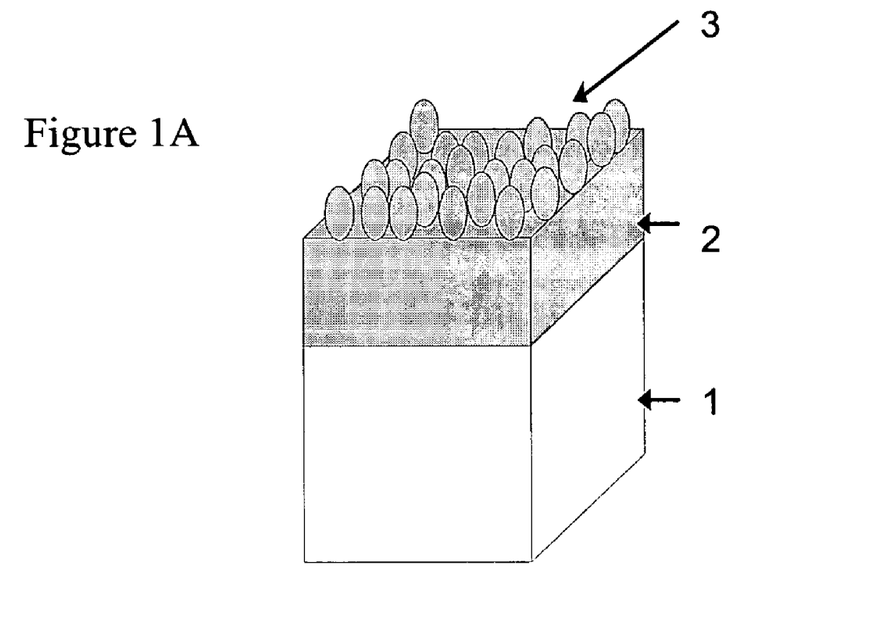
FIGS. 1A–D are schematic cross section illustrations of an embodiment of a process flow.

FIG. 1A shows a substrate comprising a surface layer (1) in which macropores have to be formed. The substrate itself can be of a dielectric material, e.g. glass, quartz, low-cost substrates such as ceramic substrates, or of a conductive substrate, such as a silicon wafer. This surface layer (1) can be of a dielectric material, e.g. oxide or nitride, or of conductive material. Also, layers of semiconductive materials, e.g. Si, Ge, SiGe alloys, III–V compounds such as GaAs, AlGaAS, can be used.

Upon this surface layer a random pattern of submicron features (3) is formed. Alternative ways of forming such a random pattern are now disclosed.

Such random pattern of submicron features can be obtained by depositing particles of, e.g., silicon oxide ("silica") or silicon nitride, upon the substrate or by using island-growth of, e.g., silicon on oxide. European patent application EP 0977 280 A2, hereby incorporated by reference in its entirety, discloses various methods of forming a random pattern of submicron features on a surface.

In this patent application this random pattern is used to mask the surface during a subsequent etching step thereby resulting in roughening of this surface. This roughening of the surface will assist in increasing the light emitting efficiency of the optical device which surface is being roughened. A correlation exists between the wavelength of the emitted light and the dimensions of the submicron features: this correlation is, however, not relevant for purposes of this disclosure.

As will be explained later, the dimensions of the submicron features are selected in order to obtain the desired diameter of the etched trenches and optionally of cavities emanating from these etched trenches.

Such a random pattern can be formed according to processing, disclosed in "7. Surface Roughening (see FIG. 13.)" sections [0084] to [0085] of this European application. Polysterene spheres are dispensed over the surface in the form of a monolayer. The spheres are shrunk by means of oxygen plasma, resulting in a substantially random pattern of separated particles having substantially the same diameter.

In the same European patent application alternative methods are disclosed for forming such a random pattern in or on a layer, see "Summary of the invention", sections [0032] to [0036] and "Detailed Description of the present invention", sections [0062] to [0065].

Optionally the surface layer (1) is covered with an intermediate layer (2) and the pattern of submicron features (3) is then formed upon this intermediate layer (2). This intermediate layer can be a dielectric material, such as oxide or nitride. Preferably this intermediate layer can be removed selectively with respect to the surface layer.

Optionally the submicron features (3) are only formed in selected areas upon the substrate.

Rita Vos, et al., discloses in "Removal of Submicrometer Particles from Silicon Wafer Surfaces Using HF-Based Cleaning Mixtures", Journal Of ElectroChem. Soc. 2001, no 148, p 683, hereby incorporated by reference in its entirety, methods to deposit such submicrometer particles on a surface, see section "Experimental" and the adherence properties between such deposited submicrometer particles and this surface.

From table III, one can conclude that, e.g., SiO2 particles adhere much stronger to a $Si_3N_4$ surface than to a $SiO_2$ surface. Hence, silica particles in a solution of neutral pH will not deposit on oxide layers, but these silica particles will deposit on nitride layers. Hence an intermediate layer (2) comprising a pattern of oxide regions and nitride regions can be formed such that silica particles are deposited mainly within the nitride regions, to be used therein as an etching mask, while the remainder of the substrate is protected against etching by the oxide regions.

A skilled technologist will realize that based on the information disclosed by Vos, et al., other material combinations can be made to obtain the same selective deposition effect.

Figure 1B:
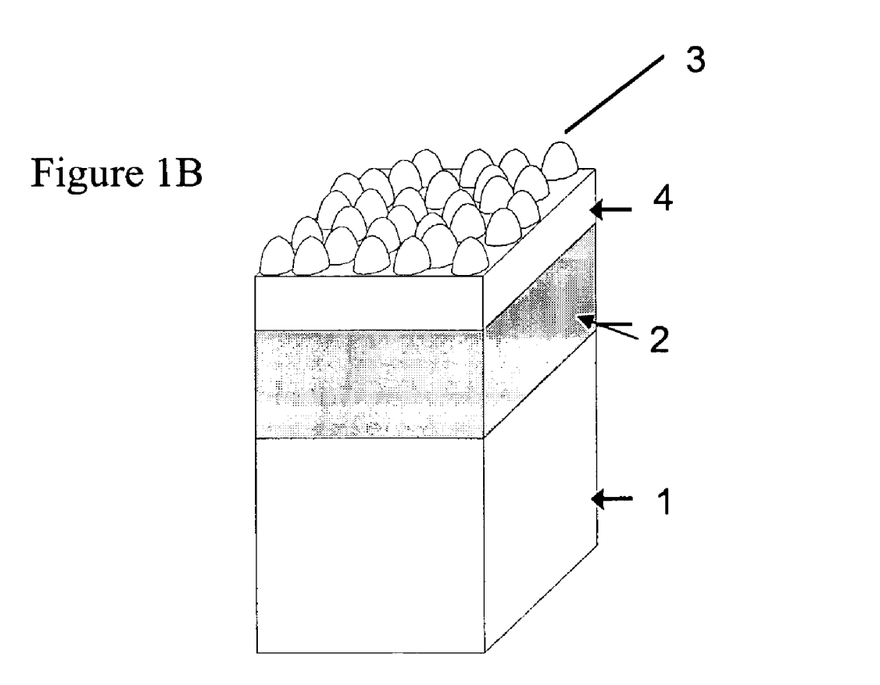

FIG. 1B shows the surface layer (1) with the random pattern of submicron particles (3) covered with a layer (4). This cover layer (4) must be selectively removable with respect to the surface layer, the submicron particles (3) and/or to the intermediate layer (2).

Various materials can be used to form this layer: dielectric materials, such as oxide or nitride, and conductive materials, such as silicon or silicon-germanium alloys.

A skilled technologist will realize that these layers can be formed using a broad range of deposition techniques such as, for example, chemical vapor deposition or spin-on depositing.

This cover layer (4) is then removed until the submicron particles are exposed. Chemical Mechanical Polishing (CMP) is one technique that can be used to remove such a layer, but other techniques such as etch back of the cover layer might be applied.

Figure 1C:
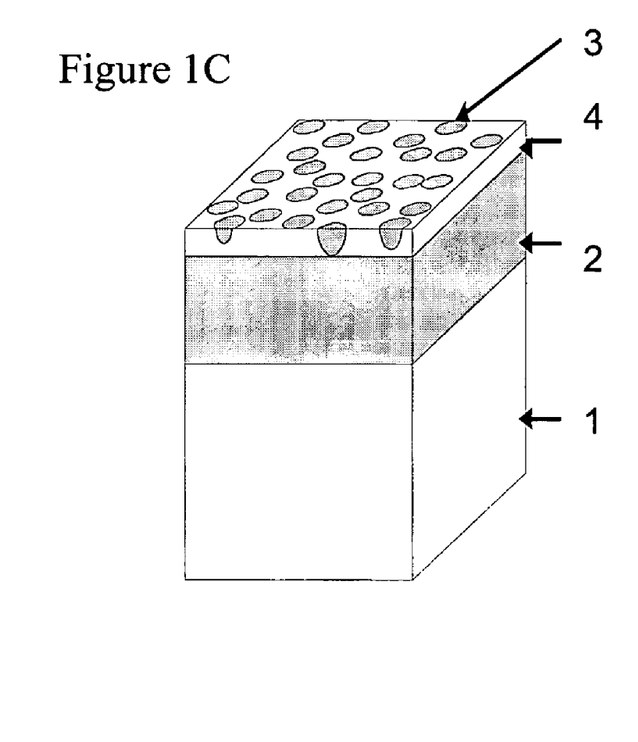

FIG. 1C shows the surface layer (1) with the exposed submicron particles (3) surrounded by the cover layer (4) after the polishing step. The submicron particles are then removed, at least selectively with respect to the cover layer (4).

By removing the submicron particles (3), the pattern of these particles is printed into or transferred towards at least the cover layer (4). After removal of the submicron particles (3), a pore network is obtained.

The cover layer now comprises a random pattern of submicron openings (5), through which the underlying surface, e.g., of the surface layer, of the substrate (1) or of the intermediate layer (2), covered by the cover layer (4) is exposed.

The thus patterned cover layer is then used as a hardmask to etch trenches or vias (6) into the intermediate layer (2) and or further into the surface layer (1) or into the substrate. Only through these openings (5) will the etchant reach the layers covered by the patterned cover layer to create microchannels substantially vertical to the substrate. Dry etching, such as plasma or reactive ion etching, may be used to form these microchannels (6).

Depending on the settings of the etching parameters the etching may remain anisotropic during the etching process yielding substantial vertical vias (6) or the etching isotropy may vary during the etching process, e.g. an initial anisotropic etch process will result in narrow vias (6), having substantially the same diameter as the openings (5), but when afterwards the isotropy is increased etching will also occur in horizontal direction, resulting in the creation of cavities within the surface layer (1) and/or the substrate.

Depending on the etching time and the envisaged application the etched vias (6) can extend over a part or over the whole of the surface layer, and optionally over the substrate.

Kitt Wai Kok, et al., discloses in "In situ trench etching and releasing technique of high aspect ratio beams using magnetically enhanced reactive ion etching", J. Vac. Sci. Technol. B 20(1), January/February 2002 p 154, hereby incorporated by reference in its entirety, in the section "Experiments" an example of such an HBr-based etch process to form these microchannels or deep trenches in a substrate. The field of application is the manufacturing of surface machined devices having a high aspect ration.

The surface layer (1) can be omitted and that the submicron features (3) can be formed directly on the substrate. In case a low-cost substrate, e.g., a ceramic substrate, is used, filters with micro-openings can be formed if the vias (6) are etched throughout this substrate.

Figure 1D:
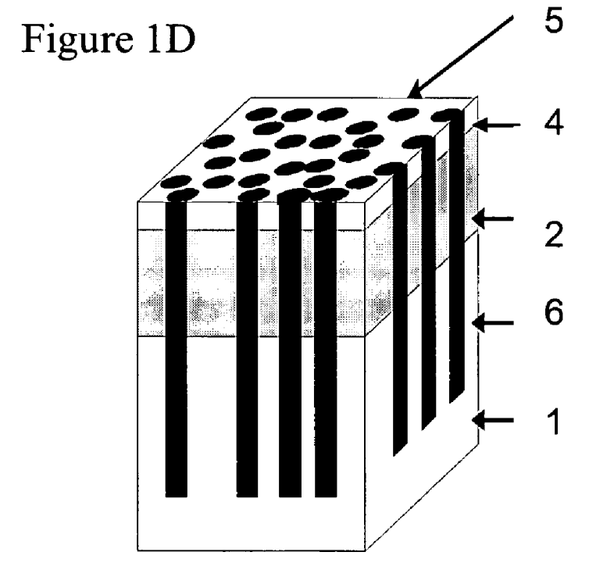

FIG. 1D shows the substrate in which microchannels (6) are formed. Optionally the cover layer is removed, preferably selective to the intermediate layer (2) and/or to the surface layer (1).

In order to control the diameter of the later formed macropores (6) the submicron particles should preferably be spherical shaped.

In one embodiment of the invention, silica particles (3) are deposited, followed by the deposition of a polysilicon cover layer (4). Silica particles have the advantage of being commercially available in a wide range of well-controlled diameters ranging from tens of nanometers to several micrometers. As small size vias (6) have to be formed, silica particles having a diameter of less then 400 nanometers, more preferably of less than 100 nanometers, are used.

Figure 2A:
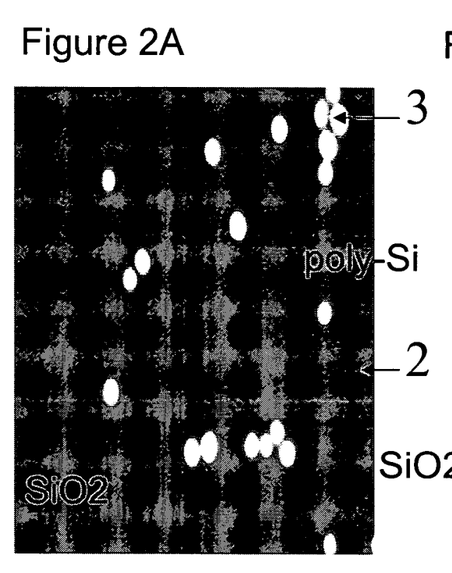
FIGS. 2A–C are SEM pictures illustrating the steps of (a) dispensing SiO2 particles on a substrate, (b) depositing thereupon a polysilicon layer and (c) polishing this polysilicon layer at least until these SiO2 particles are exposed.
Figure 2B:
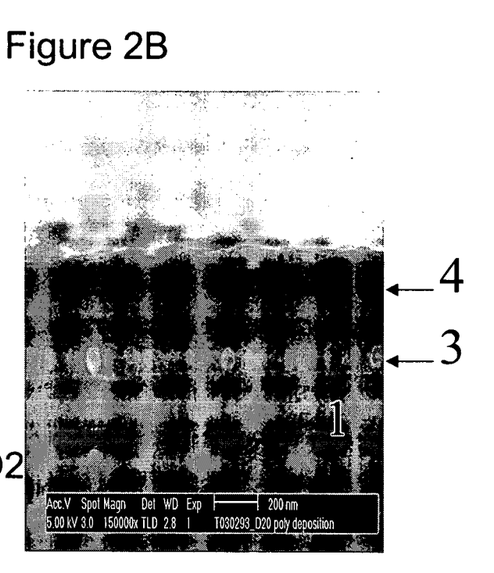
Figure 2C:
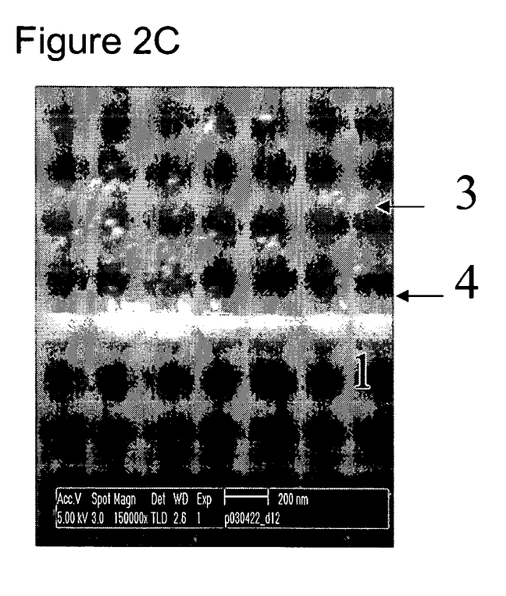

As an example to this embodiment illustrated by FIGS. 2A–C $SiO_2$ particles (3) are distributed over an oxide hardmask (2) overlying a silicon wafer (1).

These particles are dispensed using the following steps. A solution, comprising 1 ml solution of 30% SiO2 particles having a typical average diameter of about 80 nm, 25 ml HCl and 225 ml H20, is prepared. About 40 ml of this prepared solution is dispensed over the wafer. After 2 minutes waiting time, the wafer is spun dry at about 3000 rpm (FIG. 2A). The wafer is then put into a furnace for 1 hour at about 900 Celsius in nitrogen/10% oxygen ambient. Some wafers were subjected to a cleaning step, comprising the steps of a 10 minutes treatment with SPM (4:1$H_2SO_4$/$H_2O_2$) mixture at 90° C., 10 minutes rinsing, 2 minutes treatment with diluted HF 0.5%, 5 minutes rinsing, drying of the wafers. The wafers without a clean had about 8000±3000 particles/$cm^2$, while the wafers with clean had about 5000±1500 particles/$cm^2$. Then 250 nm of polysilicon (4) was deposited (FIG. 2B), followed by a chemical mechanical polishing step (FIG. 2C).

In another embodiment polystyrene latex spheres (3) are deposited. Also these latex spheres (3) are commercially available in a wide range of well-controlled diameters. After deposition of these latex spheres (3) a layer (4) of a spin-on-glass material is formed. Then a heat treatment or plasma treatment can be performed, e.g., to strengthen the spin-on-glass material, during which treatment the polystyrene latex spheres will be removed. The removal of the latex spheres (3) will leave a matrix or pore network (5) of spin-on-glass behind that can be used as etch mask to etch vias (6) in the underlying layer(s).

In a second aspect of the invention, the method of the first aspect further comprises the step of forming cavities in the surface layer (1) and/or in the substrate. These cavities can be used to form a so-called silicon-on-nothing substrate or can be used to form a cleavage plane allowing the lift-off the porous layer.

In a first embodiment of the second aspect cavities are formed emanating from the etched vias (6) to create silicon-on-nothing structures.

Figure 3A:
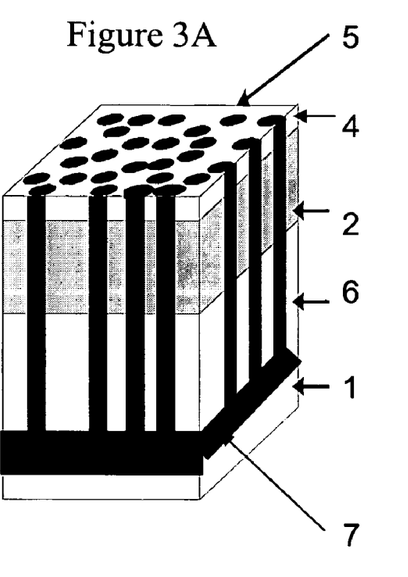
FIGS. 3A–C illustrate the formation of subsurface voids according to an embodiment of the invention: (a) starting from substantial vertical vias, (b) starting from widened vias, (c) SEM picture showing a silicon-on-nothing substrate

Depending on the settings of the etching parameters the etching may remain anistropic during the etching process yielding substantial vertical vias (6) as illustrated by FIG. 3A.

Figure 3B:
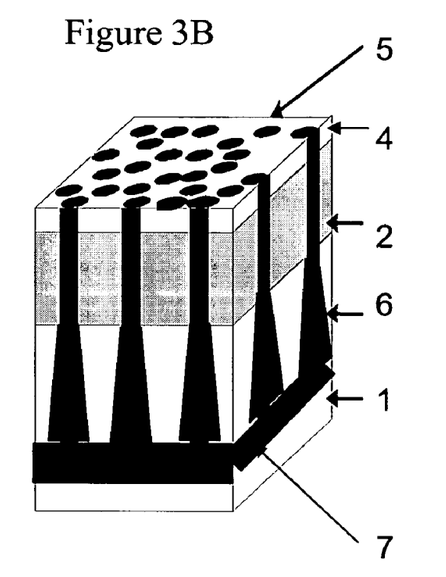

The etching isotropy may vary during the etching process, e.g. an initial anistropic etch process will result in narrow vias (6), having substantially the same diameter as the openings (5), but when afterwards the isotropy is increased etching will also occur in horizontal direction, resulting in a lateral expansion of the vias (6) and the creation of cavities within the surface layer (1) and/or the substrate, as illustrated by FIG. 3B. The widening of the etched vias (6) may assist in the formation of subsurface voids (7).

The thus formed vertical vias (FIG. 3A) or cavities can be further expanded by performing annealing steps.

This sideway expansion of the macropores (6) to form subsurface voids (7) is disclosed, inter alia, by T. Sato, et al., in "SON (silicon on nothing) MOSFET using ESS (Empty Space in Silicon) technique for SOC applications (IEDM 2001, p 809–812).

This optional anneal step will cause the substrate material to reflow, resulting in the formation of a crystalline overlayer (8) above the subsurface vacancies (7) which are associated with each opening (5) and via (6).

For long enough annealing times and small enough pitch between the openings (5) the vias (6) merge into a large subsurface vacancy (7) having a well-defined height and position below the substrate surface, i.e. the thickness of the overlayer (8).

Figure 3C:
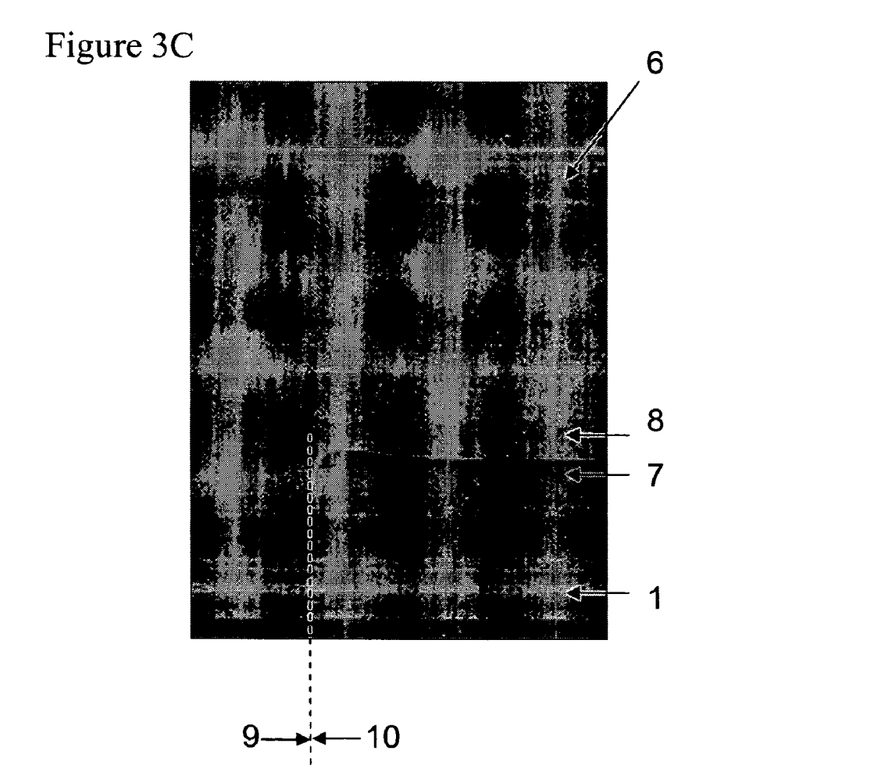

FIG. 3C shows a SEM picture of the resulting SON structure. On the left side of the SEM a field region (9) is shown, while on the right side an active region (10) is present. In the active area (10) shown in FIG. 3C vias (6) are present in a thin silicon layer (8), which openings (6) end in a large cavity (7) separating the thin overlayer (8) from the silicon substrate (1).

As is the case for the better-known silicon-on-insulator substrates the thickness of the silicon layer (8) will be a critical parameter for the performance of active devices formed thereupon.

This thickness can be controlled by the size, the pitch and the distribution of the etched vias (6). The smaller the pitch between the vias the thinner the silicon layer (8) can be.

Although the distribution of the vias (6) is random, the average via concentration should be constant within a range of 500 nanometers to yield the best results.

Figure 4A:
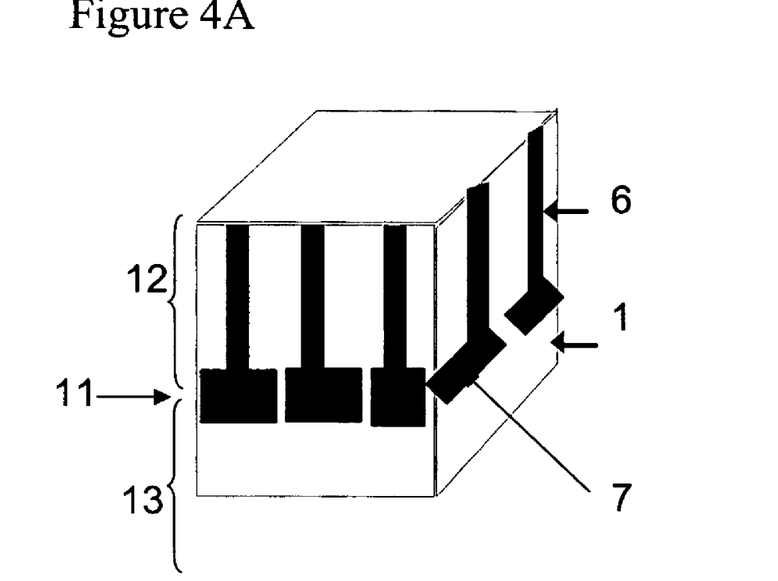
FIGS. 4A–B illustrates the formation of a cleavage plane comprising isolated subsurface voids according to an embodiment of the invention (a) having a porous overlayer (12), (b) having a non-porous overlayer (8)
Figure 4B:
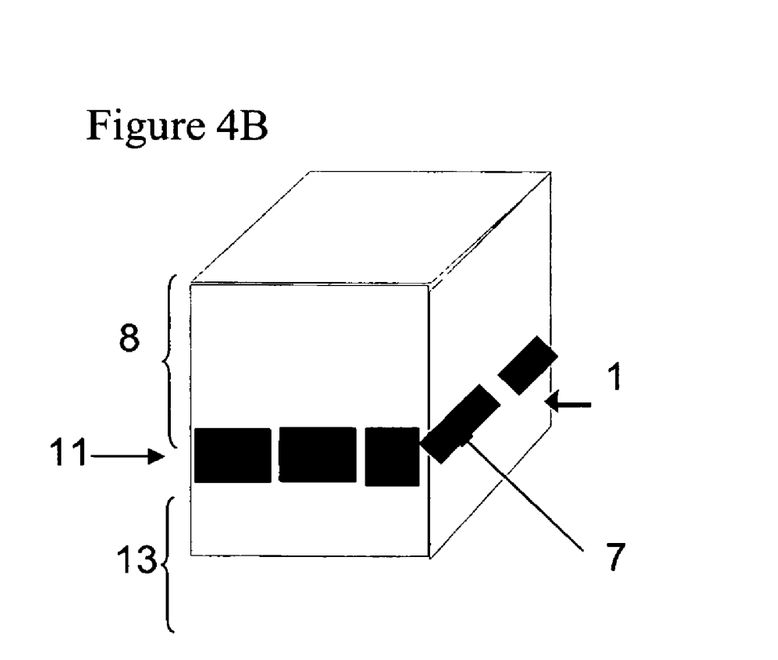

In a second embodiment of the second aspect cavities are formed emanating from the etched vias (6) to create a cleavage plane as illustrated by FIGS. 4A and 4B.

Whereas in the first embodiment of this aspect the lateral expansion of the etched vias (6) is promoted to form subsurface voids (7) in selected areas of the substrate, these subsurface voids (7) can be formed all over the substrate resulting in a cleavage layer (11) as illustrated in FIG. 4.

In this embodiment a layer of isolated subsurface voids (7) is formed over the whole area of the substrate.

As was the case in the first embodiment of this aspect, an optional anneal step can be performed resulting in a closure of the vias (6) above the subsurface voids (7).

Whereas in the previous aspect the annealing is typically performed in an inert ambient, such as argon or nitrogen, for solar cell applications it might be more advantageous to use a hydrogen-containing atmosphere.

Also, here the anneal temperature will be in a temperature range from 900 to 1100° C.

Typically, the pitch between the openings (5) will be between 0.5 and 2 micrometer, while the diameter of the openings (5) will be between 0.2 and 1 micrometer, resulting in an overlayer (8) having a thickness between 1 to 5 micrometer as illustrated by FIG. 4B.

Then the layer (12) comprising the etched vias (6) (see FIG. 4A) or the closed overlayer (8) (see FIG. 4B) is released by using the well know techniques of bonding the porous-made layer (12) to a carrier substrate and exerting a mechanical force to break the columns separating the individual subsurface voids (7). The latter step will release the layer(s) (12) from the layer(s) 13 of the substrate. This substrate can then be reused to form a new porous layer.

U.S. Pat. No. 6,143,628, hereby incorporated by reference in its entirety, discloses such a transfer technique. In this patent, a porous cleavage plane, comprising of a high and a low porous layer, is formed in a first substrate. The substrate is bonded to a second substrate and the bonded part of the first substrate is separated from the first substrate by separating this bonded part at the high porous layer.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. A method of forming macropores in a substrate, comprising:
    forming a pattern of submicron particles on the substrate;
    covering the pattern of submicron particles with a cover layer;
    selectively removing the cover layer until the submicron particles are exposed;
    selectively removing the submicron particles to expose the substrate; and
    etching vias in the substrate using the cover layer as a hardmask.

2. The method according to claim 1, wherein the substrate comprises one of a dielectric material, ceramic material, or semiconductive material.

3. The method according to claim 1, wherein the substrate comprises a surface layer of at least one of a dielectric, a conductive, or a semiconductive material.

4. The method according to claim 1, wherein the dimensions of the submicron particles are selected to obtain the desired diameter of the vias.

5. The method according to claim 1, wherein the substrate further comprises an intermediate layer whereupon the submicron particles are formed.

6. The method according to claim 1, wherein the submicron particles are formed only in selected areas upon the substrate.

7. The method according to claim 1, wherein the pattern of submicron particles is formed by one of particle deposition, island-growth, or other method suitable for forming a pattern of submicron particles on the substrate.

8. The method according to claim 1, wherein the covering layer is formed by one of chemical vapor deposition, spin-on deposition, or technique suitable for forming a layer covering the submicron particles.

9. The method according to claim 1, wherein the covering layer is at least one of a dielectric material and a conductive material.

10. The method according to claim 9, wherein, if the covering layer is a dielectric material, the covering layer comprises at least one of an oxide and a nitride.

11. The method according to claim 9, wherein, if the covering layer is a conductive material, the covering layer comprises at least one of silicon and silicon germanium alloys.

12. The method according to claim 1, wherein removing the covering layer comprises at least one of chemical mechanical polishing, etch back, and a technique suitable for removing the covering layer selectively until the submicron particles are exposed.

13. The method according to claim 1, wherein removing the submicron particles comprises at least one of dry etch, and a technique suitable for removing the submicron particles selective to the covering layer.

14. The method according to claim 1, wherein etching the vias comprises a substantially anisotropic process, thereby yielding substantially vertical vias.

15. The method according to claim 1, wherein the etching isotropy may vary during the etching of the vias.

16. The method according to claim 1, further comprising etching cavities in the substrate.

17. The method according to claim 1, wherein etching the vias comprises an etch process that is initially anisotropic and afterwards isotropic, thereby yielding substantially vertical vias and subsurface voids and/or cavities.

18. The method according to claim 1, further comprising an annealing step.

19. The method according to claim 18, wherein the annealing step is selected to expand the etched vias in a lateral direction, thereby forming subsurface voids.

20. The method according to claim 19, wherein the anneal step is selected to close the vias above the subsurface voids.

21. The method according to claim 18, wherein the annealing step is selected to merge the vias into a large subsurface vacancy.

22. The method according to claim 21, wherein the size, pitch, and distribution of the etched vias are selected to control the height and position of the subsurface vacancy.

23. A method of forming macropores in a substrate, comprising:
    forming a pattern of submicron particles on the substrate;
    covering the pattern of submicron particles with a cover layer;
    selectively removing the cover layer until the submicron particles are exposed;

selectively removing the submicron particles to expose the substrate;

etching vias in the substrate using the cover layer as a hardmask; and annealing to expand the etched vias in a lateral direction, thereby forming subsurface voids.

24. A method of forming macropores and cavities in a substrate, comprising:

forming a pattern of submicron particles on the substrate;

covering the pattern of submicron particles with a cover layer;

selectively removing the cover layer until the submicron particles are exposed;

selectively removing the submicron particles to expose the substrate; and etching vias in the substrate using the cover layer as a hardmask, wherein an etching isotropy is initially anisotropic and subsequently increased so as to form cavities within the substrate.

* * * * *